(12) United States Patent
Bowley, Jr. et al.

(10) Patent No.: US 6,683,306 B2
(45) Date of Patent: Jan. 27, 2004

(54) ARRAY FORESHORTENING MEASUREMENT USING A CRITICAL DIMENSION SCANNING ELECTRON MICROSCOPE

(75) Inventors: Reginald R. Bowley, Jr., Essex Junction, VT (US); Emily E. Fisch, Burlington, VT (US); Debra L. Meunier, Westford, VT (US)

(73) Assignee: International Business Machines Corporation, Armonk, NY (US)

( * ) Notice: Subject to any disclaimer, the term of this patent is extended or adjusted under 35 U.S.C. 154(b) by 243 days.

(21) Appl. No.: 09/878,580

(22) Filed: Jun. 11, 2001

(65) Prior Publication Data

US 2002/0185598 A1 Dec. 12, 2002

(51) Int. Cl.⁷ ............................................... G01N 23/00
(52) U.S. Cl. ......................... 250/310; 250/306; 250/307
(58) Field of Search .................. 356/625, 635, 356/636, 634; 250/310, 306, 307; 438/14

(56) References Cited

U.S. PATENT DOCUMENTS

| | | | |
|---|---|---|---|
| 5,629,772 A | * | 5/1997 | Ausschnitt .................. 356/625 |
| 5,757,507 A | | 5/1998 | Ausschnitt et al. |
| 5,790,254 A | | 8/1998 | Ausschnitt |
| 5,847,818 A | | 12/1998 | Lin et al. |
| 5,962,867 A | | 10/1999 | Liu |

* cited by examiner

Primary Examiner—Huan Tran
(74) Attorney, Agent, or Firm—Scully, Scott, Murphy & Presser; William D. Sabo, Esq.

(57) ABSTRACT

A method and system for measuring lithographic image foreshortening. The method comprises the steps of providing a critical dimension scanning electron microscope, and using that critical dimension scanning electron microscope to measure lithographic image foreshortening. Preferably, a defined feature is formed using a lithographic process, and the critical dimension scanning electron microscope is used to measure foreshortening of that feature. For example, the feature may be a line, and the critical dimension scanning electron microscope may be used to measure foreshortening of the line. Also, the feature may be two arrays of lines, and the critical dimension scanning electron microscope may be used to measure the separation distance between the arrays. That separation distance may be used to determine a focus of the lithographic process.

18 Claims, 1 Drawing Sheet

30

LITHOGRAPHIC APPARATUS

32

CRITICAL DIMENSION SEM

34

ARRAY FORESHORTENING MEASUREMENT USING A CRITICAL DIMENSION SCANNING ELECTRON MICROSCOPE

BACKGROUND OF THE INVENTION

1. Field of the Invention

The present invention relates generally to manufacturing processes requiring lithography, and more particularly, to measuring the foreshortening of array features that occurs during the lithographic process.

2. Description of Related Art

Lithography has a broad range of industrial applications, including the manufacture of semiconductors, flat-panel displays, micromachines, and disk heads.

The lithographic process allows for a mask or reticle pattern to be transferred via spatially modulated light (the aerial image) to a photoresist film on a substrate. Those segments of the absorbed aerial image, whose energy exceeds a threshold energy of chemical bonds in the photoactive component (PAC) of the photoresist material, create a latent image in the photoresist. In some photoresist systems the latent image is formed directly by the PAC. In others (so-called acid catalyzed photoresists), the photochemical interaction first generates acids which react with other photresist components during a post-exposure bake to form the latent image. In either case, the latent image marks the volume of photoresist material that either is removed during the development process (in the case of positive photoresist) or remains after development (in the case of negative photoresist) to create a three-dimensional pattern in the photoresist film.

The principal determinant of the photoresist image is the surface on which the exposure energy equals the photoresist threshold energy in the photoresist film. "Exposure" and "focus" are the variables that control the shape of this surface. Exposure, set by the illumination time and intensity, determines the average energy of the aerial image per unit area. Local variations in exposure can be caused by variations in substrate reflectivity and topography. Focus, set by the position of the photoresist film relative to the focal plane of the imaging system, determines the decrease in modulation relative to the in-focus image. Local variations in focus can be caused by variations in substrate film thickness and topography.

Generally, because of the variations in exposure and focus, patterns developed by lithographic processes must be continually monitored or measured to determine if the dimensions of the patterns are within acceptable range. The importance of such monitoring increases considerably as the resolution limit, which is usually defined as minimum features size resolvable, of the lithographic process is approached.

The foreshortening of array features (foreshortening is dimensional shrinking of a feature's length, rather than it's width) has been shown to be a highly sensitive measurement of lithographic focus, more so than feature width. Feature truncation is minimized at best focus. Currently, foreshortening measurements are performed using optical measurement systems. However, optical systems are susceptible to film variation, either in the imaging layer or underlying films, often requiring the optical system to be re-configured or re-calibrated to enable measurements.

SUMMARY OF THE INVENTION

An object of this invention is to provide a procedure for focusing lithographic processes.

Another object of the present invention is to provide an improved procedure for measuring the foreshortening of array features caused by lithographic processes.

These and other objectives are attained with a method and system for measuring lithographic image foreshortening. The method comprises the steps of providing a critical dimension scanning electron microscope, and using that critical dimension scanning electron microscope to measure lithographic image foreshortening. Preferably, a defined feature is formed using a lithographic process, and the critical dimension scanning electron microscope is used to measure foreshortening of that feature. For example, the feature may be a line, and the critical dimension scanning electron microscope may be used to measure foreshortening of the line. Also, the feature may be two arrays of lines, and the critical dimension scanning electron microscope may be used to measure the separation distance between the arrays. That separation distance may be used to determine a focus of the lithographic process.

Further benefits and advantages of the invention will become apparent from a consideration of the following detailed description, given with reference to the accompanying drawings, which specify and show preferred embodiments of the invention.

DETAILED DESCRIPTION OF THE PREFERRED EMBODIMENT

The present invention provides a novel method and procedure for monitoring foreshortening during lithography, and a brief discussion of the image shortening concept is provided herein below to help understand the invention.

Figure 1:
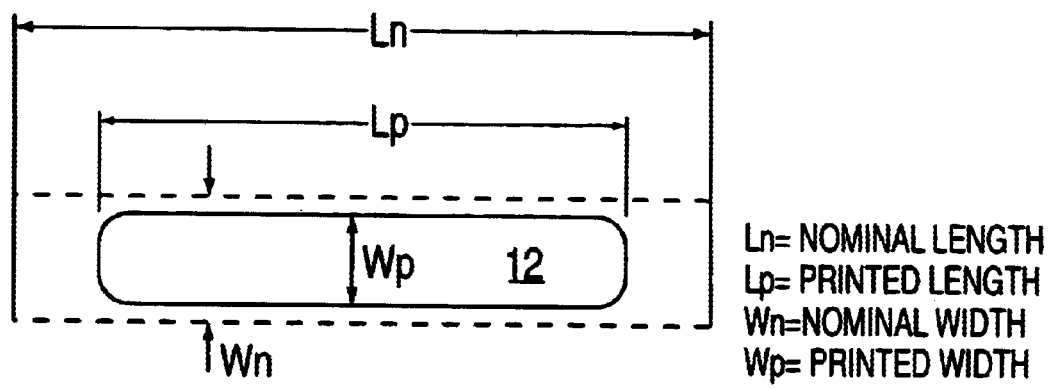
FIG. 1 is a schematic illustration of an image shortening effect.

With reference to FIG. 1, for a line or space 12, whose nominal length ($L_N$) is greater than its nominal width ($W_N$), the pattern imaged by a lithography tool in photoresist will have printed dimensions $L_P$, $W_P$. Image shortening or foreshortening describes the case where the print bias of the length ($L_N-L_P$) exceeds the print bias of the width ($W_N-W_P$). As is known in the art, the image shortening effect becomes pronounced as the resolution limit of the lithography tool/process is approached.

Figure 2:
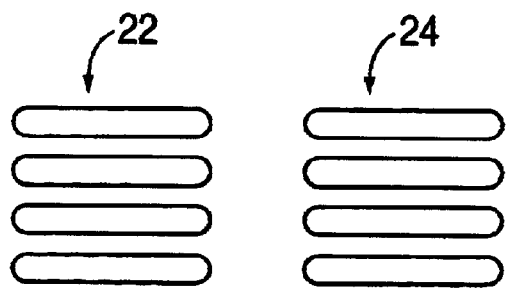
FIG. 2 schematically illustrates an array of foreshortened lines.

FIG. 2 shows two arrays of lines, referenced at 22 and 24 respectively, used to characterize the image shortening effect. For example, the array element widths may vary over a wide range of 250 nm to 700 nm. The image shortening effect is measured in this case by the change in the separation between corresponding elements of the arrays, which is roughly the same as the change in line length.

Figure 3:
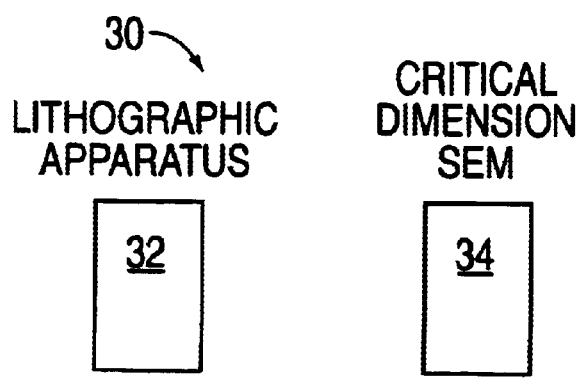
FIG. 3 schematically illustrates an array foreshortening measuring procedure embodying this invention.

FIG. 3 illustrates a system 30 for practicing this invention. Generally, this system includes a lithographic apparatus or tool 32 for forming a lithographic image; and in accordance with the present invention, foreshortening measurements are performed using a critical dimension scanning electron microscope (CD-SEM) 34. CD-SEMs are insensitive to film variation, as they are not an optically-based imaging system.

More specifically, the CDSEM can be used to measure the same array foreshortening targets as an optical system, using the same measurement technique as the optical system, without being impacted by film variations, either thickness variation or variations in the optical characteristics of the film(s). The optical technique used to measure foreshortening is to treat the end of an array of sub-resolution patterns as an edge. The separation length between the ends of neighboring arrays will change as a function of lithographic focus, with best focus having the smallest separation length. Using high density scanning at a relatively low magnification and the appropriate measurement algorithm, the CDSEM can also treat the ends of array features (either lines or spaces) as single edges, without being impacted by film variations.

While it is apparent that the invention herein disclosed is well calculated to fulfill the objects stated above, it will be appreciated that numerous modifications and embodiments may be devised by those skilled in the art, and it is intended that the appended claims cover all such modifications and embodiments as fall within the true spirit and scope of the present invention.

What is claimed is:

1. A method of measuring lithographic image foreshortening, comprising the steps:

providing a critical dimension scanning electron microscope; and using said critical dimension scanning electron microscope to measure foreshortening in an image formed in a film by a lithographic process.

2. A method according to claim 1, further comprising the step of forming a feature using the lithographic process; and wherein the using step includes the step of using the critical dimension scanning electron microscope to measure foreshortening of said feature.

3. A method according to claim 2, wherein:

the forming step includes the step of forming a foreshortened line; and the using step includes the step of using the critical dimension scanning electron microscope to measure foreshortening of said line.

4. A method according to claim 2, wherein:

the forming step includes the step of forming first and second arrays of lines; and the using step includes the step of using the critical dimension scanning electron microscope to measure a separation length between the arrays.

5. A method according to claim 4, wherein the lines of the first array define a first array edge, and the lines of the second array define a second array edge substantially parallel to the first array edge, and the step of using the critical dimension scanning electron microscope to measure a separation length includes the step of using the critical dimension scanning electron microscope to measure the distance between the first and second array edges.

6. A method according to claim 5, further comprising the step of using said separation length to determine a focus of the lithographic process.

7. A system for measuring lithographic image foreshortening, comprising:

a lithographic processing apparatus for forming a lithographic image in a film; and a critical dimension scanning electron microscope to measure foreshortening of the formed lithographic image.

8. A system according to claim 7, wherein the lithographic image includes a defined feature; and the critical dimension scanning electron microscope includes means to measure foreshortening of said feature.

9. A method according to claim 8, wherein:

the defined feature is a foreshortened line; and the critical dimension scanning electron microscope includes means to measure foreshortening of said line.

10. A system according to claim 8, wherein:

the defined feature includes first and second arrays of lines; and the critical dimension scanning electron microscope includes means to measure a separation length between the arrays.

11. A system according to claim 8, wherein the lines of the first array define a first array edge, and the lines of the second array define a second array edge substantially parallel to the first array edge, and the critical dimension scanning electron microscope includes means to measure the distance between the first and second array edges.

12. A system according to claim 11, further comprising means for using said separation length to determine a focus of the lithographic apparatus.

13. A method according to claim 1, wherein the measurement is independent in variations in the thickness of the film.

14. A method according to claim 1, wherein the measurement is independent of optical characteristics of the film.

15. A method according to claim 2, wherein:

the forming step includes the step of first and second arrays of elements; and the array element widths are between 250 nm to 700 nm.

16. A system according to claim 7, wherein the measurement is independent of variations in the thickness of the film.

17. A system according to claim 7, wherein the measurement is independent of optical characteristics of the film.

18. A system according to claim 8, wherein:

the defined feature includes first and second arrays of elements; and the array element widths are between 250 nm to 700 nm.

* * * * *